United States Patent
Nakai et al.

(10) Patent No.: US 10,541,068 B2
(45) Date of Patent: Jan. 21, 2020

(54) CONNECTION STRUCTURE OF SUPERCONDUCTING WIRES

(71) Applicant: Furukawa Electric Co., Ltd., Tokyo (JP)

(72) Inventors: Akinobu Nakai, Tokyo (JP); Toshiaki Amano, Tokyo (JP); Hisaki Sakamoto, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 15/940,358

(22) Filed: Mar. 29, 2018

(65) Prior Publication Data

US 2018/0218809 A1 Aug. 2, 2018

Related U.S. Application Data

(63) Continuation of application No. PCT/JP2016/078664, filed on Sep. 28, 2016.

(30) Foreign Application Priority Data

Oct. 1, 2015 (JP) ................. 2015-195751

(51) Int. Cl.
*H01B 12/06* (2006.01)
*H01F 6/06* (2006.01)
*H01R 4/68* (2006.01)
*H01L 39/02* (2006.01)

(52) U.S. Cl.
CPC ............... *H01B 12/06* (2013.01); *H01F 6/06* (2013.01); *H01L 39/02* (2013.01); *H01R 4/68* (2013.01); *Y02E 40/642* (2013.01)

(58) Field of Classification Search
CPC ............. H01B 12/06; H01F 6/06; H01R 4/68
USPC ........................................ 174/84 R
See application file for complete search history.

(56) References Cited

U.S. PATENT DOCUMENTS

| 5,079,222 A | 1/1992 | Yamazaki |
| 5,225,394 A | 7/1993 | Yamazaki |
| 5,786,304 A * | 7/1998 | Kimura ............... C04B 35/4508 428/701 |
| 6,159,905 A * | 12/2000 | Buzcek ................ H01L 39/02 174/125.1 |

(Continued)

FOREIGN PATENT DOCUMENTS

| CN | 103875125 A | 6/2014 |
| EP | 0306287 A2 | 3/1989 |

(Continued)

OTHER PUBLICATIONS

International Search Report and Written Opinion dated Nov. 8, 2016 for PCT App. No. PCT/JP2016/078664 (English Translation of ISR only).

(Continued)

*Primary Examiner* — Timothy J Thompson
*Assistant Examiner* — Michael F McAllister
(74) *Attorney, Agent, or Firm* — Dorsey & Whitney LLP

(57) ABSTRACT

A connection structure of superconducting wires includes a plurality of superconducting wires are overlapped and connected with each other, each of the plurality of superconducting wires including a substrate and a superconducting layer that are laminated. A non-superconductor is provided at a part of a surface of the superconducting layer of at least one of the superconducting wires and protrudes from the surface.

8 Claims, 5 Drawing Sheets

(56) References Cited

U.S. PATENT DOCUMENTS

| | | | |
|---|---|---|---|
| 8,993,485 B2* | 3/2015 | Oh | H02G 15/34 29/599 |
| 2010/0210468 A1* | 8/2010 | Lee | H01L 39/02 505/410 |
| 2014/0205975 A1 | 7/2014 | Champagne | |
| 2014/0296078 A1 | 10/2014 | Oh et al. | |
| 2015/0045229 A1* | 2/2015 | Mitsuhashi | H01B 12/02 505/230 |
| 2015/0332812 A1* | 11/2015 | Takemoto | H01F 6/06 505/230 |
| 2015/0348682 A1 | 12/2015 | Wang et al. | |
| 2016/0190788 A1* | 6/2016 | Mitsuhashi | H01R 4/68 174/84 R |
| 2016/0240284 A1* | 8/2016 | Tosaka | H01F 6/065 |
| 2019/0035518 A1 | 1/2019 | Wang et al. | |

FOREIGN PATENT DOCUMENTS

| | | |
|---|---|---|
| JP | 06045046 A | 2/1994 |
| JP | 2012230869 A | 11/2012 |
| JP | 2013235699 A | 11/2013 |
| WO | 2014116289 A1 | 7/2014 |
| WO | 2015116289 A2 | 8/2015 |

OTHER PUBLICATIONS

English Translation of International Preliminary Report on Patentability Chapter I dated Apr. 3, 2018 for PCT Application No. PCT/JP2016/078664.

English Translation of the Written Opinion of the International Search Authority dated Nov. 8, 2016 for PCT Application No. PCT/JP2016/078664.

European Search Report dated Apr. 16, 2019 in corresponding EP application No. 16851654.0.

English translation of Corresponding CN Application No. 201680056181.7 1st Office Action dated May 29, 2019.

Office Action received in EP Application No. 16851654.0, dated Nov. 19, 2019.

* cited by examiner

CONNECTION STRUCTURE OF SUPERCONDUCTING WIRES

CROSS REFERENCE TO RELATED APPLICATIONS

This is a continuation application of International Patent Application No. PCT/JP2016/078664 filed Sep. 28, 2016, which claims the benefit of Japanese Patent Application No. 2015495751, filed Oct. 1, 2015, the full contents of all of which are hereby incorporated by reference in their entirety.

BACKGROUND

Technical Field

The present disclosure relates to a connection structure of superconducting wires connecting a plurality of superconducting wires.

Background Art

There have been developments in high temperature superconducting wires using high temperature superconductors having superconductivity at a temperature of liquid nitrogen. When manufacturing superconducting cables, superconducting coils, etc. for superconducting devices using such high temperature superconducting wires, long superconducting wires are used. A long superconducting wire is obtained by successively connecting a plurality of superconducting wires. Further, when a superconducting wire is applied to, for example, a coil used in a magnetic resonance imaging (MRI) apparatus or a nuclear magnetic resonance (NMR) apparatus, the superconducting wire needs to be formed in a loop-shape by connecting ends of the superconducting wire since energization is performed in a persistent current mode.

As a conventional technique for connecting superconducting wires with each other, Japanese Laid-Open Patent Publication No. 2013-235699, appears to disclose, for example, discloses a technique in which a film of solution containing metal constituting superconducting thin films is formed at a joint portion between superconducting thin films, and the thus-formed film of the solution is subjected to a heat treatment to form a superconducting junction at the joint portion, thereby connecting high temperature superconducting thin film wires.

However, in the conventional technique described in Japanese Laid-Open Patent Publication No. 2013-235699, which appears to disclose, when connecting the superconducting thin films of the superconducting thin film wires with each other, a calcination heat treatment and a firing heat treatment are performed with the superconducting thin films being stuck to each other, so that the superconducting characteristic lowered for the following reasons. First, since the baking treatment is performed at high temperature, a proper amount of oxygen may not be supplied to the film formed on the superconducting thin films and thus the film may not be crystalized.

Further, although an oxygen introducing treatment is performed after the baking, oxygen cannot be supplied to the film formed on the superconducting thin films, and thus there is a problem that it is impossible to secure the superconducting characteristic after the superconducting thin film wires are connected to each other.

The present disclosure is related to providing a connection structure of superconducting wires capable of connecting superconducting wires to each other while achieving a good superconducting characteristic.

SUMMARY

According to a first aspect of the present disclosure, a connection structure of superconducting wires includes a plurality of superconducting wires are overlapped and connected with each other, each of the plurality of superconducting wires including a substrate and a superconducting layer that are laminated. A non-superconductor is provided at a part of a surface of the superconducting layer of at least one of the superconducting wires and protrudes from the surface.

According to the present disclosure, since the non-superconductor is provided on a part of the surface of the superconducting layer of at least one superconducting wire, a gap is formed at a joining portion between the superconducting wires. Oxygen is sufficiently supplied from the thus-formed gap to the joining portion between the superconducting wires, so that the superconducting layers at the joining portion is crystallized, and the superconducting wires can be connected to each other without lowering the electrical characteristics.

In an example, with the connection structure of superconducting wires according to the present disclosure, a part of the non-superconductor is embedded in the surface of the superconducting layer.

In an example, with the connection structure of superconducting wires, an intermediate layer is provided between the substrate and the superconducting layer.

In an example, with the connection structure of superconducting wires according to the present disclosure, a connecting superconducting layer constituting a joining portion with another superconducting wire is formed on the surface of the superconducting layer including a protruding portion of the non-superconductor.

In an example, with the connection structure of superconducting wires according to the present disclosure, the non-superconductor contains at least one element among Cu, Ba, Al, Y, Gd, Sm, Eu, Gd, Dy, Ho, Er, Tm, Yb, Lu, Zr and Hf.

In an example, with the connection structure of superconducting wires according to the present disclosure, the non-superconductor includes $CuOx$.

In an example, with the connection structure of superconducting wires according to the present disclosure, the plurality of superconducting wires are two superconducting wires, and the non-superconductor is provided on an overlap portion which is to be a joining portion on the surface of the superconducting layer of at least one superconducting wire.

In an example, with the connection structure of superconducting wires according to the present disclosure, the plurality of superconducting wires are three superconducting wires, and, in a connection structure in which first and second superconducting wires are overlapped with and connected to a third superconducting wire, with the first and second superconducting wires being in a positional relationship in which the surfaces of the superconducting layers of the first and second superconducting wires are in the same direction with end faces of the first and second superconducting wires facing each other, and the third superconducting wire is arranged to oppose the surfaces of the superconducting layers of the first and second superconducting wires in a positional relationship in which the third superconducting wire extends across and is connected to both surfaces of the superconducting layers of the first and second superconducting wires, and the non-superconductor is provided at an overlap portion which is to be a joining portion on a surface of the superconducting layer of at least one of the opposing superconducting wires.

According to the present disclosure, a connection structure of superconducting wires capable of connecting superconducting wires while achieving a good superconducting characteristic can be provided.

DETAILED DESCRIPTION

Further features of the present disclosure will become apparent from the following detailed description of exemplary embodiments with reference to the accompanying drawings. A mode for carrying out the present disclosure (hereinafter referred to as the present embodiment) will be described with reference to an illustrative embodiment. The present embodiment relates to a connection structure of superconducting wires connecting a plurality of superconducting wires. First, prior to specific description on the connection structure of superconducting wires, the structure of a high-temperature superconducting wire will be described as an illustrative embodiment of the connection structure of superconducting wires with reference to cross-sectional views in FIGS. 1A and 1B.

(1. High-Temperature Superconducting Wire)

Figure 1A:
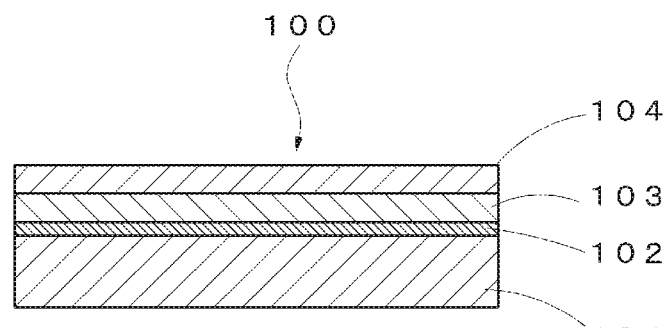
FIGS. 1A and 1B are cross-sectional views showing a lamination structure of a superconducting wire.

As shown in FIG. 1A, a high-temperature superconducting wire 100 is one mode of a superconducting wire according to the present disclosure, and includes a substrate 101, an intermediate layer 102, a superconducting layer 103, and a protection layer 104.

The substrate 101 is formed to have a tape-like shape. For example, a low-magnetic non-oriented metal substrate or a non-oriented ceramic substrate is used as the substrate 101. As a material of the metal substrate, a metal such as Co, Cu, Ni, Ti, Mo, Nb, Ta, W, Mn, Fe, Ag or Cr, or an alloy thereof is used, which are excellent in strength and heat resistance. Stainless steels and nickel-based alloys represented by Hastelloy (registered trademark) which are excellent in corrosion resistance and heat resistance are particularly preferable. Further, for example, MgO, $SrTiO_3$ or yttrium stabilized zirconia or the like is used as a material of the ceramic substrate.

The intermediate layer 102 is an arbitrary layer serving as a base of the superconducting layer 103, and is a layer formed on the substrate 101 in order to achieve a high biaxial orientation property in the superconducting layer 103. For the intermediate layer 102, materials such as MgO and $CeO_2$ are used in which values of physical characteristics such as a coefficient of thermal expansion and a lattice constant are intermediate values between the substrate 101 and a superconductor constituting the superconducting layer 103. The intermediate layer 102 may have a monolayer structure or a multilayer structure. In a case where the substrate 101 is as metal substrate, the intermediate layer 102 may be a ceramic thin film.

The superconducting layer 103 is formed on a surface of the intermediate layer 102, and with a superconductor as a main component, comprises at least one of elements among Cu, Ba, Y, Gd, Sm, Eu, Gd, Dy, Ho, Er, Tm, Yb, Lu, Zr and Hf. Specifically, a RE-based superconductor represented by $REBa_2Cu_3O_{7-\lambda}$ ($\lambda$ represents an integer from 0 to 6) is used as the superconductor. RE in the RE-based superconductor contains a single rare earth element or a plurality of rare earth elements of Y, Nd, Sm, Eu, Gd, Dy, Ho, Er, Tm, Yb or Lu.

Figure 1B:
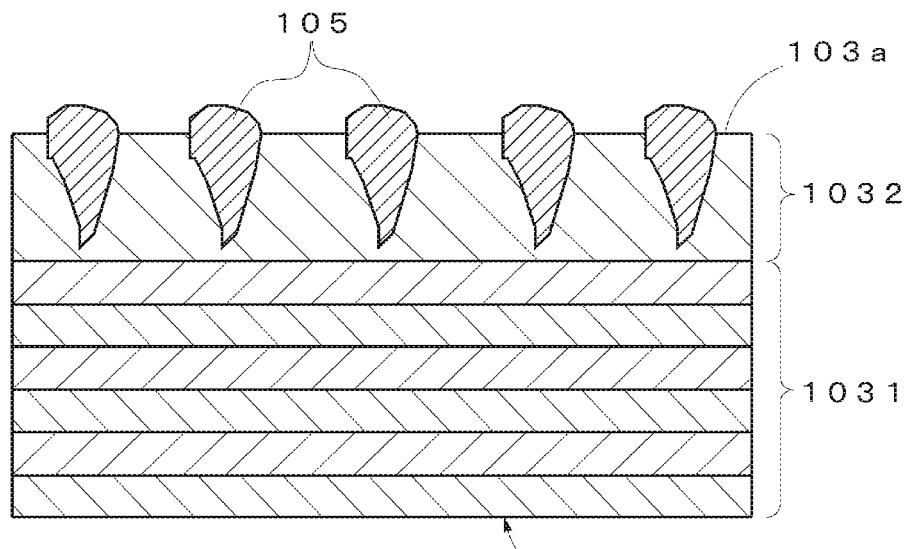

In order to connect superconducting wires 100, 100 with each other while achieving a good superconducting characteristic as described later, a non-superconductor 105 such as $Cu_xO$ is provided at a surface 103a of the superconducting layer 103 as shown in FIG. 1B.

Specifically, as shown in FIG. 1B, when the superconducting layer 103 is formed to have a multilayer structure by a chemical vapor deposition (CVD) method such that a film thickness per layer is less than 200 nm in a lower layer region 1031 which is from the lowermost layer to the sixth layer, and a film thickness of an uppermost layer 1032 (seventh layer) is greater than or equal to 200 nm, it is possible to cause the non-superconductor 105 (for example, copper oxide) to precipitate at the surface 103a of the superconducting layer 103 without affecting the superconducting characteristic of the superconducting layer 103. More specifically, the non-superconductor 105 can be formed such that a part of the non-superconductor 105 is embedded in the superconducting layer 103 while the remaining part of the non-superconductor 105 protrudes from the surface 103a of the superconducting layer 103. Further, an area density of the non-superconductors 105 on the surface 103a of the superconducting layer 103 can be checked or measured by observing the surface 103a of the superconducting layer 103 with an electron microscope or the like.

As described above, in the lamination step of the superconducting layer 103 by the CVD method, by thickening the film thickness per layer to greater than or equal to 200 nm, copper oxide ($Cu_xO$) particles which are the non-superconductor 105 can be produced more easily. The non-superconductor 105 is not limited to copper oxide ($Cu_xO$) described above, but may be formed of at least one of elements among Cu, Ba, Al, Y, Gd, Sm, Eu, Gd, Dy, Ho, Er, Tm, Yb, Lu, Zr and Hf.

Furthermore, the non-superconductor 105 may be provided to protrude from the surface 103a of the superconducting layer 103 by not only a CVD method, but also other methods such as a MOD method and a sol-gel method.

The protection layer 104 is any layer covering the surface of the superconducting layer 103. For example, Ag or the like is used for the protection layer 104.

(2. Connection Structure of Superconducting Wires)

Next, two superconducting wires 100 each having the foregoing lamination structure are prepared, and a connecting step of connecting the prepared superconducting wires 100, 100 will be described with reference to FIGS. 2A to 2C. For convenience's sake, one superconducting wire 100 will be referred to as a superconducting wire 100A, and the other superconducting wire 100 will be referred to as a superconducting wire 100B.

Figure 2A:
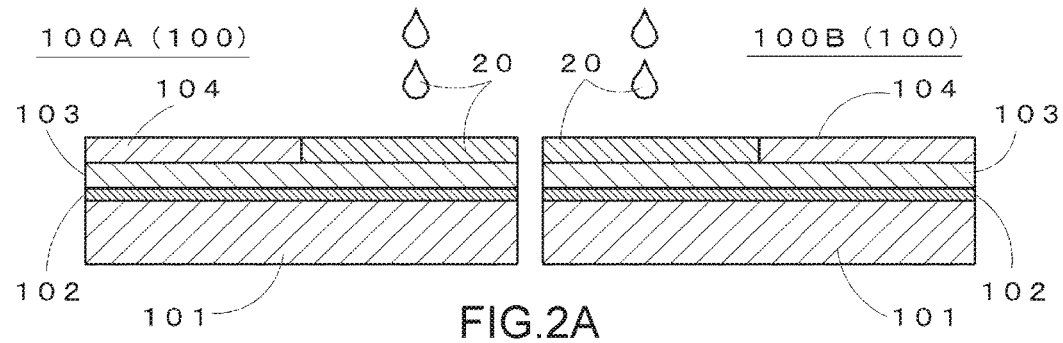
FIGS. 2A to 2C are cross-sectional views for illustrating a connecting step for connecting superconducting wires.

First, as shown in FIG. 2A, for each of the superconducting wire 100A and the superconducting wire 100B, the protection layer 104 is etched only at a region necessary for connection to expose the superconducting layer 103.

Thereafter, a connecting superconducting layer 200 is formed by a metal organic decomposition (MOD) method. Specifically, first, a raw material solution 20 containing organic metal complex of Y, Ba, Cu or the like is prepared. The prepared raw material solution 20 is coated on a surface of the exposed superconducting layer 103. Here, the raw material solution 20 is coated over the entire surface of the exposed superconducting layer 103, but the coating amount is not specifically limited, and may be determined as appropriate. In the present embodiment, the method of coating the raw material solution 20 by the MOD method is presented, but the present embodiment is not limited thereto.

Figure 2B:
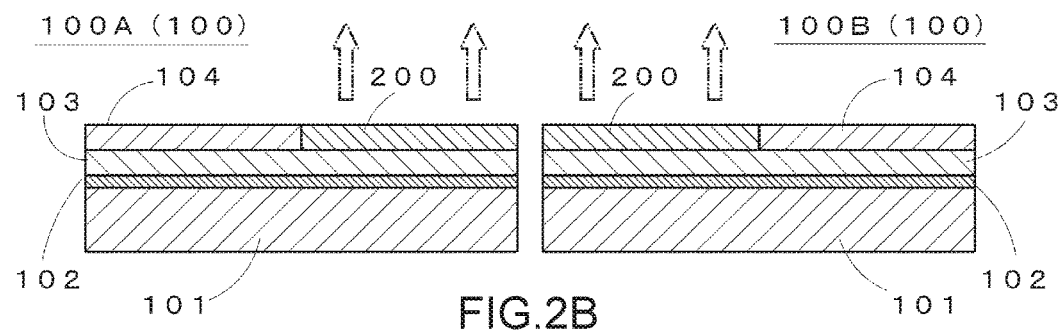

Subsequently, as shown in FIG. 2B, each of the superconducting wire 100A and the superconducting wire 100B is subjected to calcination, so that organic solvent is vaporized from the raw material solution 20 coated on the surface of the superconducting layer 103. Here, calcination is performed by conducting a heat treatment at 400 to 600° C., for example. The organic metal complex contained in the raw material solution 20 is decomposed by calcination. By performing calcination as described above, the connecting superconducting layer 200 is formed over the entire surface of the superconducting layer 103 including a portion where the non-superconductor 105 is protruding.

Figure 2C:
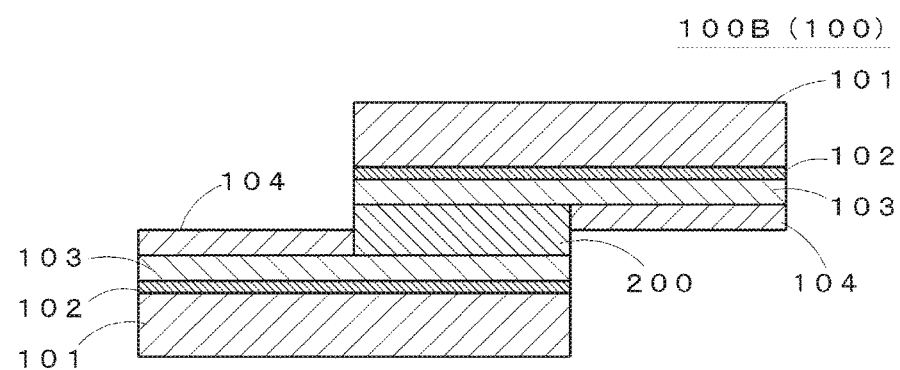

Subsequently, as shown in FIG. 2C, the connecting superconducting layers 200 which have been respectively formed on the superconducting layers 103 of the superconducting wires 100A and 1003 are overlapped with each other and pressed against each other with a predetermined pressure. Thereafter, the connecting superconducting layers are placed in an atmosphere of a low oxygen concentration, for example in an Ar atmosphere with oxygen concentration of 50 to 1000 ppm, and subjected to a firing treatment at a temperature of about 750° C. to 850° C. while being pressed against each other. Through the firing treatment, the connecting superconducting layers 200 are crystallized, whereby the connecting superconducting layers 200 are bonded to each other. Furthermore, as an oxygen anneal treatment, the temperature is decreased in an Ar atmosphere with an in oxygen concentration of greater than or equal to 50% to introduce oxygen into the connecting superconducting layers 200 which have been subjected to the firing treatment. This introduction of oxygen causes the connecting superconducting layers 200 to have a structure exhibiting the superconducting characteristic.

Figure 3A:
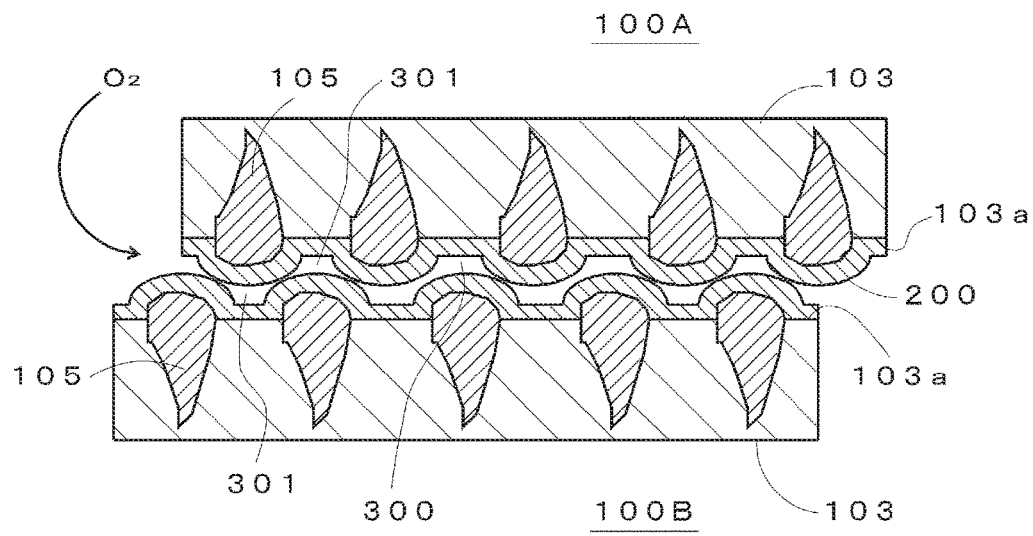
FIG. 3A is a cross-sectional view showing a connection structure according to the present disclosure.

FIG. 3A is an enlarged view showing the structure of a connecting region of the superconducting wires 100A and 1001 in the step of introducing oxygen described above. As is apparent from FIG. 3A, since each of the superconducting wires 100A and 100B is provided with the non-superconductor 105 at the surface 103a of the superconducting layer 103, the surfaces of the connecting superconducting layers 200 have irregularities. By overlapping the superconducting wires 100A and 100B with each other in such a manner that the connecting superconducting layers 200 having the uneven surfaces as described above oppose each other, a gap 300 is formed at a joining portions of the superconducting wires 100A and 100B, that is, between the connecting superconducting layers 200 and 200. By forming the gap 300 described above, oxygen is sufficiently supplied to the connecting superconducting layers 200, 200 in the oxygen introducing step, so that the connecting superconducting layers 200, 200 are crystalized, and voids 301 are formed around the non-superconductors 105.

As described above, the non-superconductors 105 protrude from the surface 103a of the superconducting layers 103. It is preferable that the protruding portions of the non-superconductors 105 have an average diameter ranging from 0.1 to 10 μm and an average height ranging from 0.01 to 5 μm. The average diameter is obtained by observing with SEM to measure longest diameters and calculating an average value of the longest diameters. The average height can be measured by cutting the protruding portions in the thickness direction and observing cross-sections with SEM. When the average diameter and the average height are excessively large, there is a tendency that lots of voids are formed around the non-superconductors, and the connection strength decreases. When the average diameter and the average height are excessively small, the voids formed are small, and oxygen cannot be supplied sufficiently, so that a good superconducting characteristic cannot be obtained.

Figure 3B:
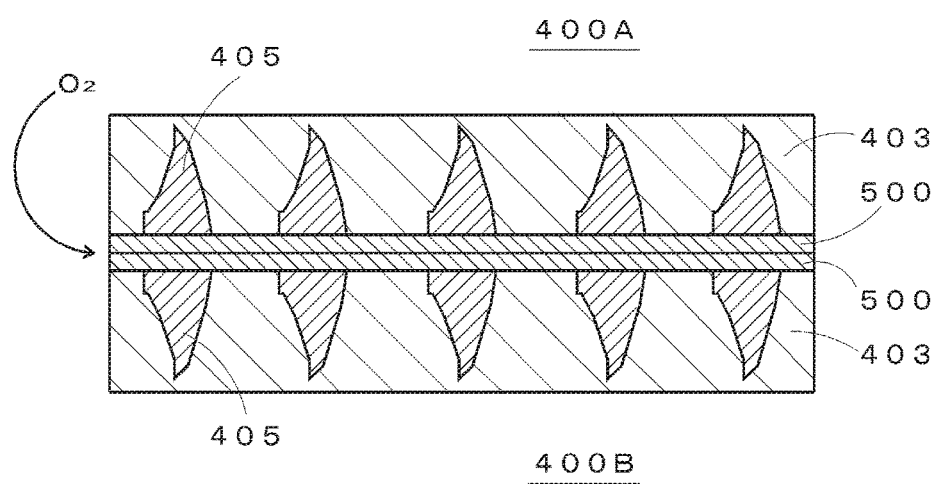
FIG. 3B is a cross-sectional view showing a connection structure according to a comparative example.

In comparison to the embodiment described above, FIG. 3B is an enlarged view of the structure of a connecting region of superconducting wires 400A and 400B according to a comparative example. Each of the superconducting wires 400A and 400B according to the comparative example is obtained by polishing a non-superconductor 405 provided on a surface of a superconducting layer 403 to flatten. The surface of the superconducting layer 403. When the surfaces of the superconducting layers 403 are flat in this manner, the surfaces of connecting superconducting layers 500, 500 are also flat, so that almost no gap 300 as shown in FIG. 3A is formed. As a result, the connecting superconducting layers 500 and 500 are not crystallized, and a good superconducting characteristic cannot be achieved.

As is apparent from the result of comparison between the foregoing comparative example and the present embodiment, according to the connection structure of the superconducting wires 100A and 100B of the present embodiment, since the connecting superconducting layers 200, 200 respectively formed on the superconducting wires 100A and 100B are positively crystallized, the superconducting wires 100A and 100B can be connected with each other without deteriorating the electrical characteristics.

The film thickness of the connecting superconducting layer 200 ranges, when film formation is performed by a MOD method, preferably from 10 nm to 5 μm. This is because excessively small film thickness causes a decrease in the connection area between the connecting superconducting layers 200, 200, whereas with an excessively large film thickness, the gap 300 cannot be formed and crystallization is made difficult.

According to the connection structure of the superconducting wires 100A and 100B of the present embodiment, the voids 301 are formed, and thus it is preferable in that oxygen can be sufficiently supplied to the connecting superconducting layers 200 until crystallization is positively performed.

Furthermore, in the present embodiment, the non-superconductor 105 protrudes from the surfaces 103a of the superconducting layers 103, and is also embedded in the surfaces 103a of the superconducting layers 103, so that the connection strength can be enhanced. Particularly, although existence of the voids 301 described above causes reduction in connection strength, the present embodiment is preferable in that a strong connection structure can be achieved because the non-superconductors 105 are embedded in the surfaces 103a of the superconducting layers 103.

(3. Variant Embodiment)

Figure 4A:
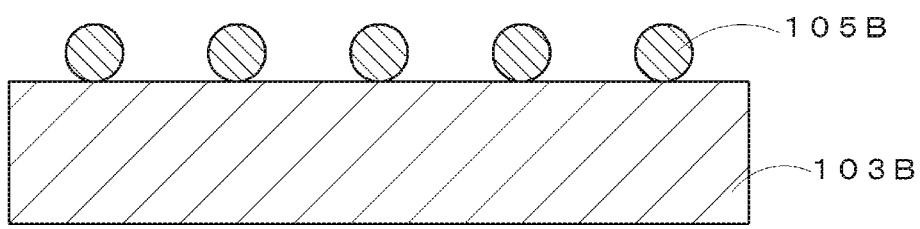
FIGS. 4A and 4B are cross-sectional views for explaining a non-superconductor according to a variant embodiment.
Figure 4B:
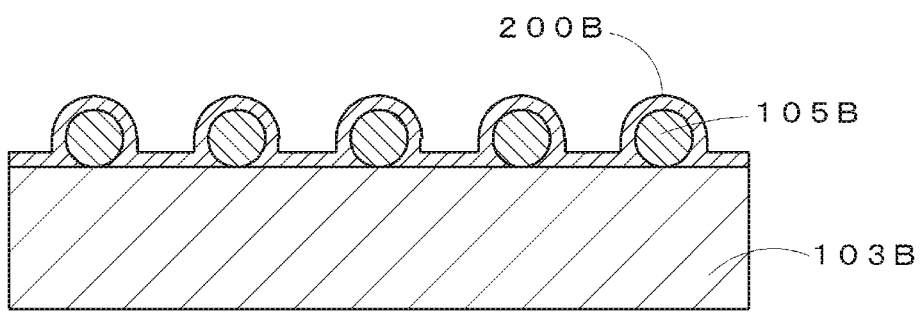

The non-superconductor 105 of the present embodiment is not limited to those protruding from the surfaces 103a of the superconducting layers 103 and embedded in the surfaces 103*a* of the superconducting layers 103. For example, FIGS. 4A and 4B show a non-superconductor 105B according to a variant embodiment. That is, as shown in FIG. 4A, on a surface of a superconducting layer 103B grown to have a flat surface, fine particles of alumina or the like may be provided as the non-superconductor 105B. Subsequently, as shown in FIG. 4B, on the superconducting layer 103B provided with the non-superconductors 105B, a raw material solution is coated and subjected to calcination to form a connecting superconducting layer 200B having an uneven surface. Particularly, according to the variant embodiment shown in FIGS. 4A and 4B, the uneven shape (the number of protrusions and recesses) of the surface 103*a* of the superconducting layer 103 can be easily adjusted by adjusting the density of the fine particles or the like without changing any of the conditions of the film formation of the superconducting layer 103. That is, the surface 103*a* of the superconducting layer 103 can be configured to have a surface shape suitable for crystallization of the connecting superconducting layer 200 by a simple method.

(4. Other Application Examples)

Further, in the present embodiment, as shown in FIGS. 2A to 2C and FIGS. 3A and 3B, a case in which, in the connection structure in which the two superconducting wires 100A and 100B are overlapped with and connected to each other so that the superconducting layers 103 face each other, a non-superconducting layer 105 is provided at the overlapped portions at the surfaces of the superconducting layers has been illustrated. However, even in various connection structures, the superconducting wires can be connected to each other while achieving good superconducting characteristics. Here, "the overlapped portion at the surface of the superconducting layer" indicates a portion which will be afterwards joined to another superconducting layer and to be a joining portion. Specifically, it means a region of the surface of the superconducting layer which is exposed by etching and removing the protection layer.

Figure 5:
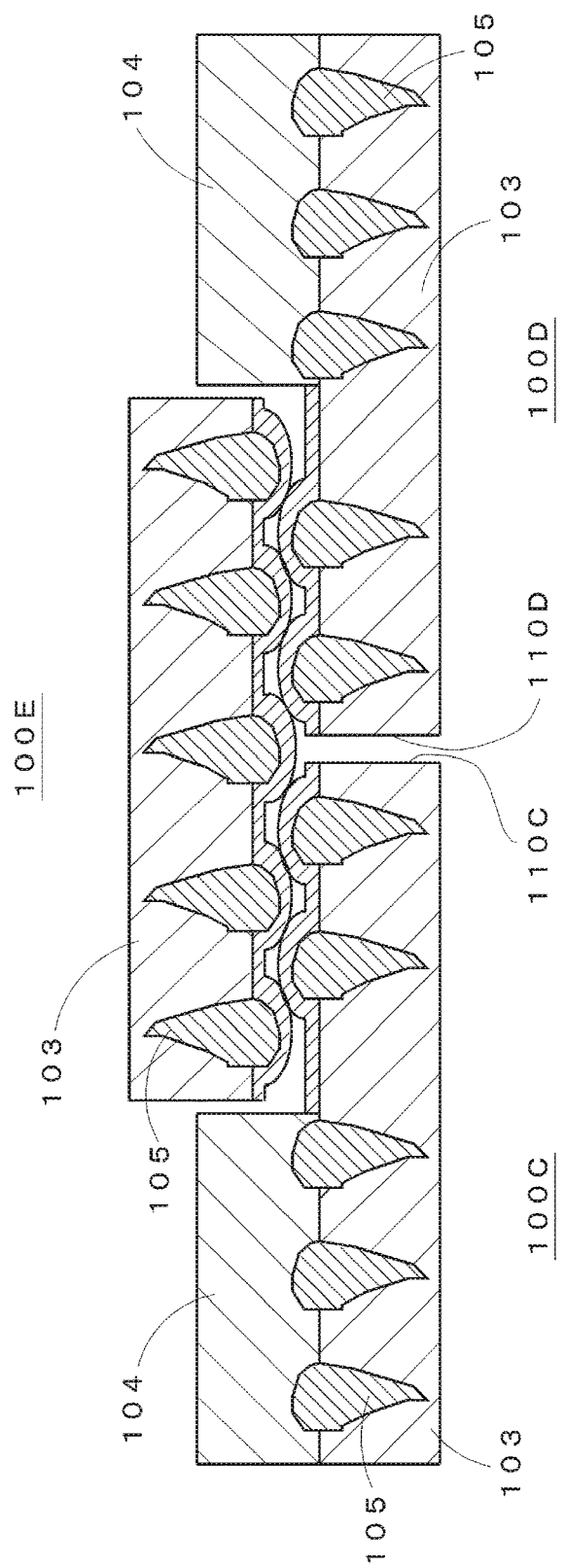
FIG. 5 is a cross-sectional view for explaining another application example according to the present embodiment.

For example, as shown in FIG. 5, as another application example, a connection structure is illustrated in which first and second superconducting wires 100C and 100D are overlapped with and connected to a third superconducting wire 100E, with the first and second superconducting wires 100C and 100D being in a positional relationship in which the surfaces of the superconducting layers of the first and second superconducting wires 100C and 100D are in the same direction with end faces of the first and second superconducting wires 100C and 100D facing each other, and the third superconducting wire 100E is arranged to oppose the surfaces of the superconducting layers of the first and second superconducting wires 100C and 100D in a positional relationship in which the third superconducting wire extends across and is connected to both of surfaces of the superconducting layers of the first and second superconducting wires 100C and 100D. The non-superconductors 105 are provided at the surface of the superconducting layer 103 of each of the first to third superconducting wires 100C, 100D and 100E, whereby the first to third superconducting wires 100C, 100D and 100E can be connected to one another while achieving a good superconducting characteristic.

In an application example other than the application example shown in FIG. 5, it is possible to achieve a substantially Y-shaped branched connection structure, for example, by dividing a termination region of one superconducting wire into two regions and making two different superconducting wires come face to face with each other in each of the regions.

(5. Others)

In the present embodiment, the non-superconductors are provided on the surfaces of the superconducting layers of all the superconducting wires to be connected. However, the present disclosure is not limited to such an embodiment. For example, non-superconductors may be provided on only one superconducting layer of two superconducting layers facing each other. When the surface of the connecting superconducting layer of one superconducting wire has irregularities, a gap is formed between the connecting superconducting layers, and the connecting superconducting layers can be positively crystallized. Furthermore, as shown in FIG. 2C, when parts of the superconducting layers are connected with each other, it is not necessary to provide the non-superconductors on the entire surfaces of the superconducting layers, and the non-superconductors may be provided on at least the overlap portions of the surfaces of the superconducting layers.

What is claimed is:

1. A connection structure of superconducting wires comprising:
    a plurality of superconducting wires are overlapped and connected with each other, each of the plurality of superconducting wires including a substrate and a superconducting layer that are laminated, a non-superconductor being provided at a part of a surface of the superconducting layer of at least one of the superconducting wires and protruding from the surface,
    wherein a part of the non-superconductor is embedded in the surface of the superconducting layer,
    the superconducting layer has a multilayer structure including an uppermost superconducting layer and at least one superconducting layer other than the uppermost superconducting layer, the uppermost superconducting layer having a thickness greater than a thickness of the at least one superconducting layer other than the uppermost superconducting layer, and
    the part of the non-superconductor is embedded in the uppermost superconducting layer and a remaining part of the non-superconductor is protruded from the surface of the superconducting layer.

2. The connection structure of superconducting wires according to claim 1, wherein an intermediate layer is provided between the substrate and the superconducting layer.

3. The connection structure of superconducting wires according claim 1, wherein a connecting superconducting layer constituting a joining portion with another superconducting wire is formed on the surface of the superconducting layer including a protruding portion of the non-superconductor.

4. The connection structure of superconducting wires according to claim 1, wherein the non-superconductor contains at least one element among Cu, Ba, Al, Y, Gd, Sm, Eu, Gd, Dy, Ho, Er, Tm, Yb, Zr and Hf.

5. The connection structure of superconducting wires according to claim 1, wherein the non-superconductor includes $Cu_xO$.

6. The connection structure of superconducting wires according to claim 1, wherein the plurality of superconducting wires are two superconducting wires, and the non-superconductor is provided on an overlap portion which is to be a joining portion on the surface of the superconducting layer of at least one superconducting wire.

7. The connection structure of superconducting wires according to claim 1, wherein the plurality of superconducting wires are three superconducting wires, and, in a connection structure in which first and second superconducting wires are overlapped with and connected to a third superconducting wire, with the first and second superconducting wires being in a positional relationship in which the surfaces of the superconducting layers of the first and second superconducting wires are in the same direction with end faces of the first and second superconducting wires facing each other, and the third superconducting wire is arranged to oppose the surfaces of the superconducting layers of the first and second superconducting wires in a positional relationship in which the third superconducting wire extends across and is connected to both surfaces of the superconducting layers of the first and second superconducting wires, and the non-superconductor is provided at an overlap portion which is to be a joining portion on a surface of the superconducting layer of at least one of the opposing superconducting wires.

8. The connection structure of superconducting wires according to claim 1, wherein the part of the non-superconductor is embedded only in the uppermost superconducting layer.

* * * * *